Figure 1A:
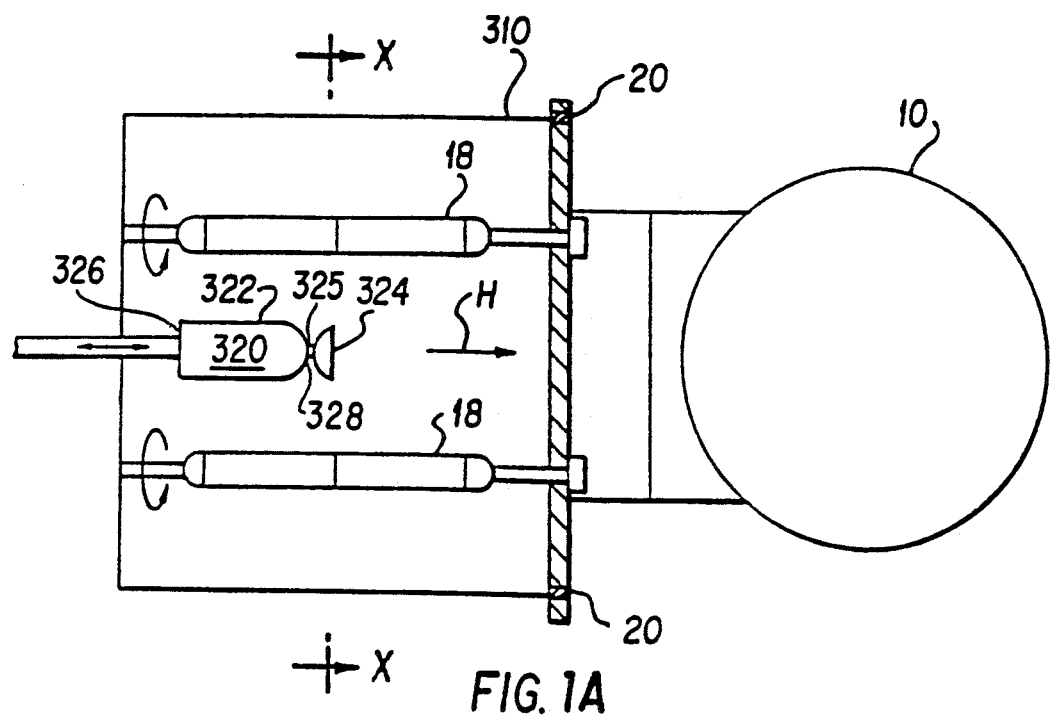
Figure 1B:
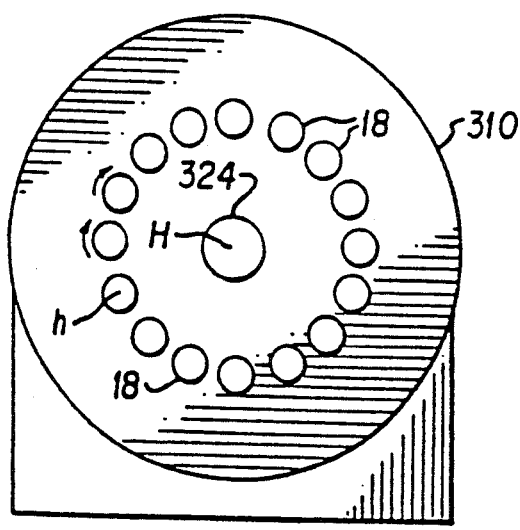
Figure 2A:
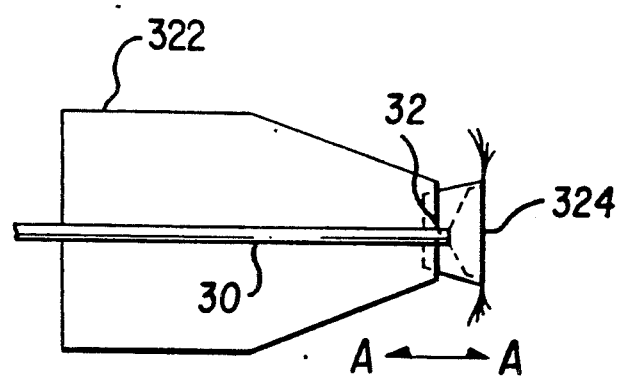
Figure 2B:
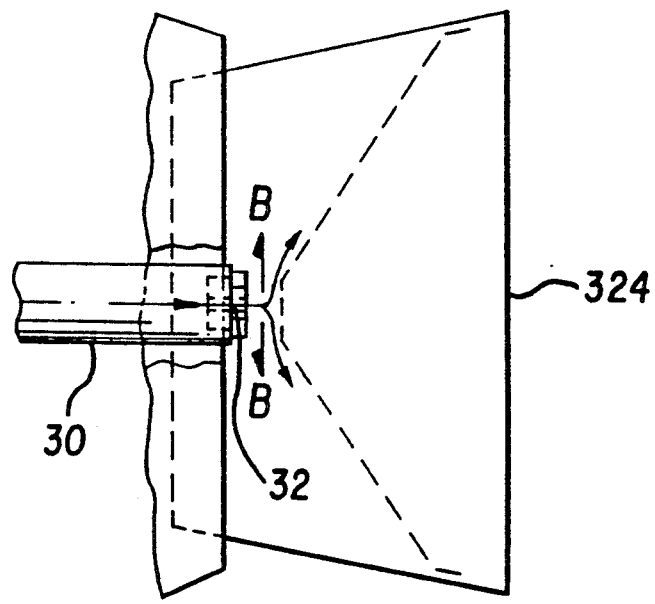
Figure 2C:
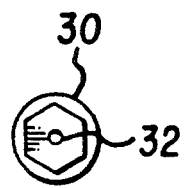
Figure 3A:
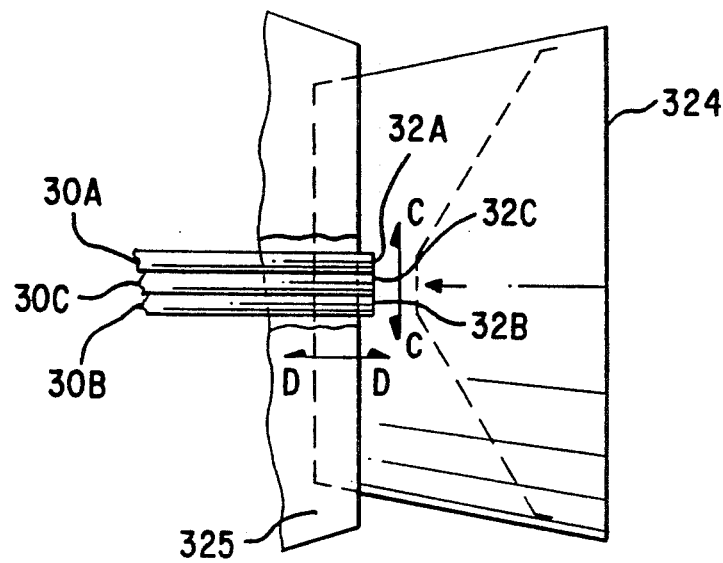
Figure 3B:
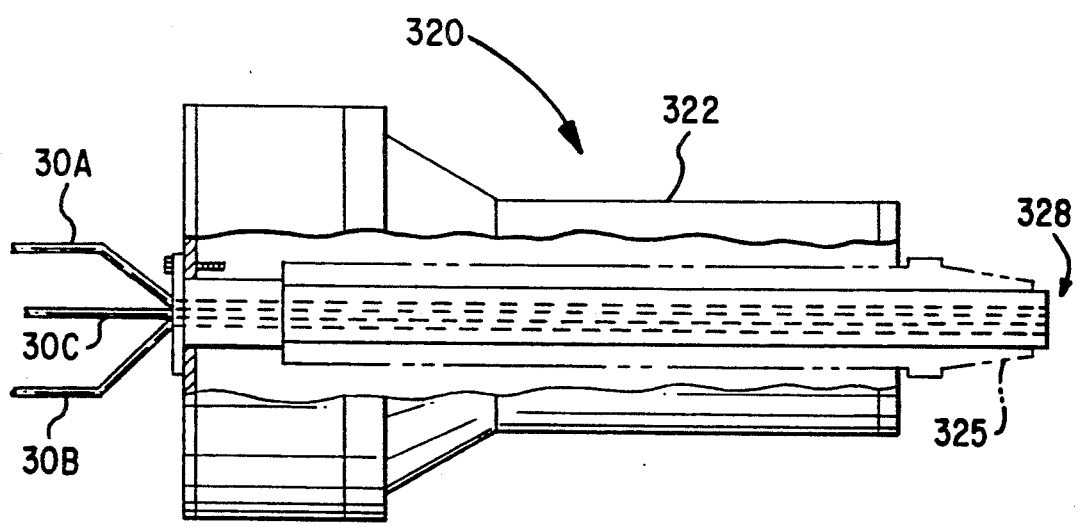

United States Patent [19]

Hammond et al.

[11] Patent Number: 5,156,336
[45] Date of Patent: Oct. 20, 1992

[54] MULTIPLE FLUID INJECTION NOZZLE ARRAY FOR ROTARY ATOMIZER

[75] Inventors: John M. Hammond, Ontario; John G. Matta, East Rochester; Richard R. Whitbeck, Ontario, all of N.Y.

[73] Assignee: Xerox Corporation, Stamford, Conn.

[21] Appl. No.: 684,210

[22] Filed: Apr. 12, 1991

Related U.S. Application Data

[63] Continuation-in-part of Ser. No. 457,958, Dec. 27, 1989, Pat. No. 5,079,854, and a continuation-in-part of Ser. No. 457,494, Dec. 27, 1989, Pat. No. 5,037,676, and a continuation-in-part of Ser. No. 457,926, Dec. 27, 1989, Pat. No. 5,090,350.

[51] Int. Cl.$^5$ .............................................. B05B 3/10
[52] U.S. Cl. .......................... 239/214.25; 239/222.11; 239/223
[58] Field of Search ............... 239/214.25, 222.11, 239/223, 549

[56] References Cited

U.S. PATENT DOCUMENTS

| | | | |
|---|---|---|---|
| 1,721,381 | 7/1929 | Ellis | 239/549 X |
| 1,823,844 | 9/1931 | Riley | 239/223 |
| 2,087,627 | 7/1937 | Nyrop | 239/222.11 X |
| 2,587,083 | 2/1952 | Andermatt | 239/214.25 X |
| 2,975,756 | 3/1961 | Reindl et al. | 239/214.25 X |
| 3,053,312 | 9/1962 | Villoresi | 239/549 |
| 3,121,024 | 2/1964 | Wampler et al. | 239/223 X |
| 3,144,209 | 8/1964 | Griffiths . | |
| 3,233,580 | 2/1966 | Levake | 239/223 X |
| 3,233,581 | 2/1966 | Levake | 239/223 X |
| 3,307,789 | 3/1967 | Clark . | |
| 3,342,415 | 9/1967 | Point . | |
| 3,355,106 | 11/1967 | Graham | 239/223 X |
| 3,452,931 | 7/1969 | Knowles | 239/214.25 |
| 3,481,546 | 12/1969 | Nielsen . | |
| 3,844,705 | 10/1974 | Miyahara | 239/214.25 X |
| 3,873,024 | 3/1975 | Probst et al. . | |
| 4,009,967 | 3/1977 | Layton | 239/223 X |
| 4,162,039 | 7/1979 | Hallerback et al. | 239/214.25 |
| 4,270,698 | 6/1981 | Bisa et al. | 239/214.25 X |
| 4,508,265 | 4/1985 | Jido . | |
| 4,521,462 | 6/1985 | Smythe . | |
| 4,555,058 | 11/1985 | Weinstein et al. | 239/223 |
| 4,643,357 | 2/1987 | Culbertson et al. | 239/223 X |
| 4,785,995 | 11/1988 | Yamane et al. | 239/214.25 X |
| 4,801,086 | 1/1989 | Noakes . | |
| 4,966,205 | 10/1990 | Tanaka . | |
| 5,100,057 | 3/1992 | Wacker et al. | 239/223 |

FOREIGN PATENT DOCUMENTS

| | | | |
|---|---|---|---|
| 990398 | 9/1951 | France | 239/214.25 |
| 1121342 | 7/1968 | United Kingdom . | |

Primary Examiner—Andres Kashnikow
Assistant Examiner—William Grant
Attorney, Agent, or Firm—Oliff & Berridge

[57] ABSTRACT

A rotary atomizer for spraying fluids toward an object to be coated with the fluids includes an atomizer housing defining a central longitudinal axis and enclosing a plurality of feed tubes between an inlet end and an outlet end of the housing, and a shaft rotating about the longitudinal axis and protruding from an outlet end of the housing. A distributor is mounted on the shaft and spaced from the outlet end of the housing, for atomizing the fluids conveyed by the plurality of feed tubes and directing a spray of the fluids radially outward toward the object to be coated. A plurality of injection ports, each communicating with a corresponding feed tube is located at the outlet end of the housing for injecting the fluids toward the distributor. Each feed tube can be dedicated to a different fluid.

17 Claims, 5 Drawing Sheets

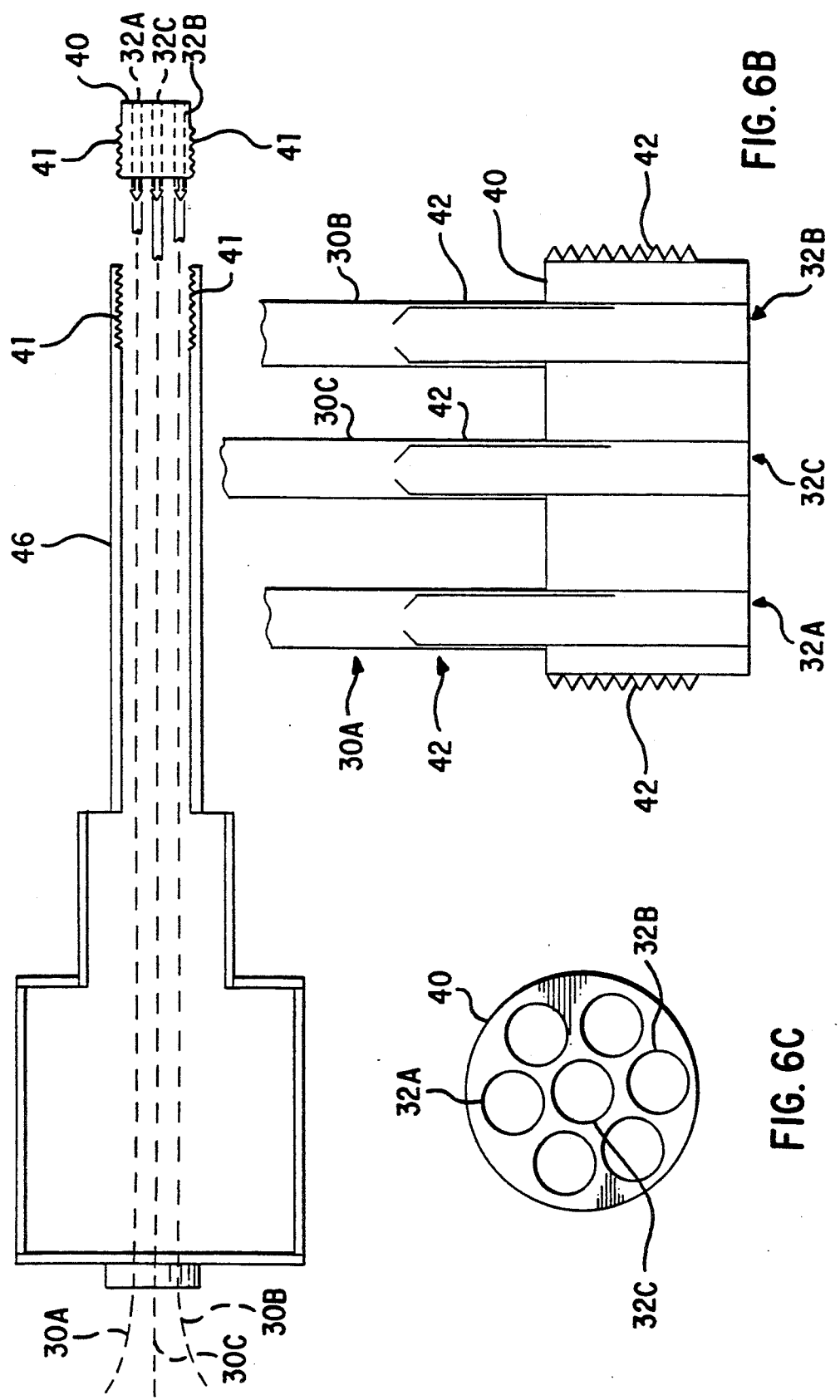

MULTIPLE FLUID INJECTION NOZZLE ARRAY FOR ROTARY ATOMIZER

CROSS REFERENCES TO RELATED APPLICATION

The present application is a continuation-in-part of U.S. Pat. Nos. 5,079,854, issued Jan. 14, 1992; 5,037,676, issued Aug. 6, 1991; and 5,090,350, issued Feb. 25, 1992, corresponding respectively to U.S. patent application Ser. Nos. 457,958, 457,494 and 457,926, all filed Dec. 27, 1989. These disclosures are herein incorporated by reference.

The present application also is technically related to U.S. patent application Ser. No. 07/684,382, filed on Apr. 12, 1991 by John M. Hammond, the disclosure of which is herein incorporated by reference.

BACKGROUND OF THE INVENTION

1. Field of the Invention

The invention relates to a rotary atomizer for coating substrates such as drum and flexible belt photoreceptors for photocopiers. More particularly, the invention relates to a rotary atomizer with a multiple array of injection ports, each of which delivers a different fluid used in the coating of the substrate.

2. Description of Related Art

A photoreceptor is a cylindrical or belt-like substrate used in a xerographic apparatus. The photoreceptor substrate is coated with one or more layers of a photoconductive material, i.e., a material whose electrical conductivity changes upon illumination. In xerographic use, an electrical potential is applied across the photoconductive layer which is then exposed to light from an image. The electrical potential of the photoconductive layer decays at the portions irradiated by the light from the image, leaving a distribution of electrostatic charge corresponding to the dark areas of the projected image. The electrostatic latent image is made visible by development with a suitable powder. Better control of the coating quality yields better imaging performance.

One method of coating substrates is to dip the substrate in a bath of the coating material. This method is disadvantageous because it usually results in a non-uniform coating. In particular, when the substrate is oriented vertically and dipped into a bath, the coating thickness tends to "thin" or decrease at the top of the substrate and "slump" or increase at the base of the substrate due to gravity induced flow of the coating material as the substrate is lifted from the bath. Thickness variations also occur even when the photoreceptor is oriented horizontally and dipped into the bath due to the formation of a meniscus as the substrate is removed from the bath. This variation in coating thickness causes variations in the performance of the photoreceptor. In addition, the dipping process requires additional processing controls because the bath must be constantly maintained in a state suitable for coating. The bath increases the size of the entire processing apparatus and is not readily adaptable to rapid changes in coating formulations. Further, changes in coating formulations are inhibited due to incompatibilities between formulations for successive coatings or layers. It is also difficult to incorporate cleaning and curing operations that are compatible with the dipping process for efficient modular operation as a manufacturing process.

In another method, an air assisted automatic spray gun uses high velocity air to atomize the coating formulation which is sprayed onto a substrate. Due to high mass transfer rates intrinsic to the use of atomizing air, this method entails considerable evaporative loss of solvent from the spray droplets and requires the use of slow evaporating solvents to prevent excessive solvent loss before the droplets arrive at the substrate. It is difficult to use this method in a sealed environment, and thus difficult to control the solvent humidity surrounding the substrates prior to, during, or after the coating process. In addition, the air atomized spray method creates a considerable amount of overspray which results in higher material usage. Air spray guns also are less advantageous for batch processing of a number of substrates.

Related Pat. Nos. 5,079,854; 5,037,676 and 5,090,350 disclose an apparatus for coating cylindrical and belt like substrates in which a planetary array of substrates 18 (FIGS. 1A and 1B) is mounted on a support structure 20 carried by a rotatable carousel 10. Each substrate !8 is rotated about a horizontal axis "h" while horizontally supported about a central horizontal axis H of the support structure 20. The support structure 20 is inserted into a coating chamber 310 having a reciprocating applicator 320 with its longitudinal axis aligned with the central horizontal axis H of the support structure 20 for applying a coating formulation radially outward into the planetary array of substrates 18.

The applicator is a rotary atomizer having a housing 322 defining an inlet end 326 and outlet end 328. The housing 322 encloses a shaft 325 rotating about the longitudinal axis and protruding from the outlet end 328 of the housing 322. A distributor or "bell" 324 is mounted on the shaft 325 and spaced from the outlet end 328 of the housing.

As illustrated in FIGS. 2A, 2B and 2C, the housing 322 of commercially available rotary atomizers has a single feed tube 30 with one injection nozzle 32 mounted at the end of the tube 30. The feed tube 30 alternately delivers various coating solutions, or flushing solvents between coating runs. The fluid is delivered to the rotating bell 324 where it is atomized (and electrically charged in cases where a high voltage is applied to the bell) such that it directs a spray radially outward. A batch delivery of a coating solution for a given layer is usually followed by a batch delivery of air and/or flushing solvent to clear the feed tube prior to delivery of a coating solution for the subsequent layer. Efficient flushing of a coating solution from the line by solvent and air is difficult. Limiting the amount of solvent and/or air used in flushing may result in coating solution residues remaining in the feed tube, which can contaminate subsequent coated layers, thereby degrading overall photoreceptor quality; while using large quantities of solvent and/or air for feed tube flushing can increase manufacturing process cycle times to unacceptably high levels.

SUMMARY OF THE INVENTION

An object of the invention is to obviate the drawbacks of prior rotary atomizers.

In accordance with the invention, a rotary atomizer for spraying fluids toward an object to be coated, comprises:

an atomizer housing defining a longitudinal axis and enclosing a hollow shaft rotating about the longitudinal axis and protruding from an outlet end of the housing and a plurality of feed tubes in the hollow shaft between an inlet end and the outlet end of the housing;

distribution means mounted on the shaft and spaced from the outlet end of the housing, for atomizing the fluids conveyed by the plurality of feed tubes and directing a spray of the fluids radially outward toward the object to be coated; and a plurality of injection ports located inside of said hollow shaft and aligned along said longitudinal axis, each communicating with a corresponding feed tube and being located at the outlet end of the housing for injecting the fluids toward the distribution means.

Each injection port can then be dedicated to deliver an individual coating solution or solvent or gas. The claimed invention provides at least the following advantages:

1) No cross contamination occurs in the tubes. When the coating fluids share a common delivery tube to the atomizer, difficulties are encountered in the flushing of the tube between successive layer coatings. Precipitate sludges often form in the tube due to solvent/polymer incompatibilities, resulting in deposition of sludge particles on photoreceptor surfaces, or total plugging of the common fluid line;
2) No line flushing is necessary between layers. This eliminates the risk of contamination of the photoreceptor devices in process by flushing waste liquid;
3) Manufacturing process cycle time is reduced, resulting in greater throughput and lower unit manufacturing costs (UMC). The multi-tube array enables all coating solutions and solvents to be primed and ready for delivery before processing begins, thus eliminating various time consuming fluid delivery preparatory steps during processing;
4) Fabrication of unique device structures such as a single layer device or multipigment device are enabled. Sequenced deposition or blending of coating solutions or multicomponent reactive fluids becomes straightforward; and
5) Flushing solvent waste volumes are minimized, since less line flushing is required. Ecological benefits of this are obvious since excess solvents are not released to the atmosphere.

BRIEF DESCRIPTION OF THE DRAWINGS

The invention will be described in detail with reference to the following figures in which like elements are denoted with like reference numerals and wherein:

FIG. 1A is a schematic cross-sectional top view of the coating chamber;

FIG. 1B is a schematic cross-sectional side view of the coating chamber taken along the lines X—X of FIG. 5A;

FIG. 2A is a schematic cross-sectional side view of a commercially available rotary atomizer into which the coating fluid is fed through a single feed tube located along the atomizer central axis;

FIG. 2B is an enlarged view of the atomizer of FIG. 2A taken along the line A—A of FIG. 2A;

FIG. 2C is an end view of the tube of FIG. 2B taken along the line B—B of FIG. 2B;

FIG. 3A is an enlarged view of the outlet end of the rotary atomizer in accordance with the claimed invention;

FIG. 3B is an enlarged side view of the atomizer of FIG. 3A illustrating the hollow shaft and inlet end;

FIGS. 4A, 4B, 4C and 4D are end views of different embodiments for the feed tubes of FIG. 3 taken along the line C—C of FIG. 3;

FIGS. 5A, 5B, 5C and 5D are side views of different embodiments for the feed tubes of FIG. 3 taken along the lines D—D of FIG. 3;

FIGS. 6A, 6B and 6C are a side view of an atomizer having another embodiment for a feed tube/nozzle assembly, an enlarged view of the nozzle assembly, and an end view of the nozzle assembly, respectively; and FIGS. 7A, 7B and 7C are an end view of another embodiment of a feed tube/nozzle assembly, a cross-sectional side view of a portion of the feed tubes, and a cross-sectional side view of the outlet end of the nozzle assembly.

DETAILED DESCRIPTION OF THE PREFERRED EMBODIMENTS

In the preferred embodiment of the invention illustrated in FIGS. 3A and 3B, the rotary atomizer 320 sprays fluids toward an object (preferably a photoreceptor) to be coated with the solution. The atomizer has an atomizer housing 322 defining a central longitudinal axis and encloses a plurality of feed tubes 30A, 30B, 30C . . . terminating at the outlet end 328 of the housing 322. A hollow shaft 325 is enclosed in the housing and protrudes from the outlet end 328 by a spaced distance. The shaft 325 rotates about the central longitudinal axis of the housing 322 and encloses the feed tubes 30A, 30B, 30C as illustrated in FIG. 3B. The housing also accommodates a plurality of turbine blades (not shown).

A distributor or bell 324 is mounted on the shaft 325 and is spaced from the outlet end of the housing 322, for atomizing fluid delivered through the feed tubes 30A, 30B, 30C . . . and directing a spray of the fluids radially outward.

A plurality of injection ports 32A, 32B, 32C . . . each communicating with a corresponding feed tube 30A, 30B, 30C . . . , is located at the outlet end of the housing for injecting the fluids toward the bell 324. As illustrated in FIGS. 4A, 4B, 4C and 4D, the number of injection ports and corresponding feed tubes may vary from three (FIG. 4A), four (FIG. 4B), seven (FIG. 4C), or more (FIG. 4D), up to about twenty tubes and ports. Preferably, the injection ports are symmetrically arranged about the central longitudinal axis.

In the preferred atomizer (a Nordson RA-12 available from Nordson Corporation of Amherst, Ohio but modified in accordance with the following structure), a space of approximately 1 cm in diameter by 20 cm long is available inside the turbine blades for the array of injection ports, i.e., the nozzle array. If the individual tubes were made small enough, perhaps as many as twenty tubes could be fitted in this space. As few as two can be used or three as illustrated in FIG. 4A. It has been found that seven tubes (FIG. 4C) is a convenient number due to current process requirements and the symmetry of the array; i.e. with equal sized tubes, six may be symmetrically spaced in a hexagonal pattern around the remaining tube which is located in the center.

With regard to process requirements, the seven tubes enable multiple coating solutions to be in the fluid tubes, primed and ready for coating. Thus it is possible to have the process prepared to coat a batch of any one of several typical two or three layered organic photoconductor drums: in the seven port array, two different undercoat fluids could be readied, as well as two different charge generator fluids, and two different charge transport fluids, for example. (Other combinations are possible.) The remaining port would likely be a solvent injector for bell flushing.

The two or more charge generator fluids could be chosen from visible light sensitive and infrared light sensitive materials, which are typically used in light lens copiers and laser printers, respectively. Thus the entire system would have the flexibility to rapidly change between and alternately produce batches of different product sets. This flexibility is beneficial in that it enables just-in-time manufacturing, the advantages of which are widely understood.

In addition, this nozzle array enables the blending of two or more charge generator materials or charge generator and charge transport materials to fabricate unique devices, which is the subject of the related application Ser. No. 07/684,382, filed Apr. 12, 1991, the disclosure of which is herein incorporated by reference.

Figure 4A:
Figure 4B:
Figure 4C:
Figure 4D:
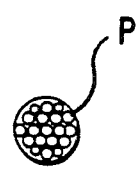
Figure 5A:
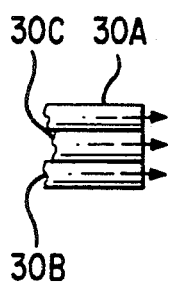
Figure 5B:
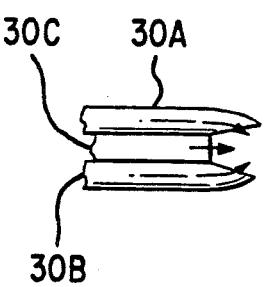
Figure 5C:
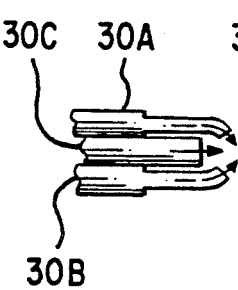
Figure 5D:
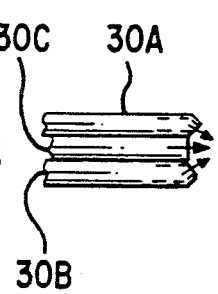
Figure 7A:
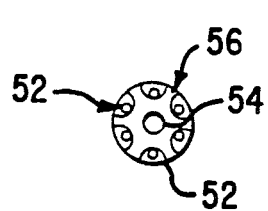
Figure 7B:
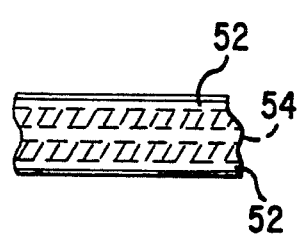
Figure 7C:
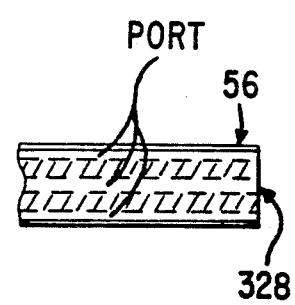

Stainless steel hypodermic needle tubing can be used to fabricate the array. This material is precision manufactured, solvent compatible, and readily available. Individual tubes in the array can be tack welded together for structural strength (for example, see welds W in FIG. 4C).

Teflon tubing can also be used. Its low electrical conductivity may be an additional advantage in the use of certain conductive materials, as the rotary spray process is electrostatically assisted.

The tubes can be bundled tightly together and fixed in place by the use of solvent resistant sleeve or heat shrink tubing (for example, see sleeve or tubing S in FIG. 4A). They can also be potted in a solvent resistant polymer. (Possibly an epoxy or polyurethane; for example see polymer P in FIG. 4D.)

The nozzles 32A, 32B, 32C can also be fabricated in a short bundle, or tubular passageway made by boring through a solid plug of suitable material 40 (See FIG. 6A, 6B and 6C) which is preferably a solvent resistant material. This short nozzle structure can then be equipped with barbed or other suitable connections 42 for coupling to the required length of fluid delivery tubing 30A, 30B, 30C, and fastened via threads 41 or other suitable means to a fixturing tube 46 which locates the short nozzle structure as desired in close proximity to the bell (not shown in FIGS. 6A, 6B or 6C). FIGS. 6A and 6B illustrate three injection ports 32A, 32B, 32C, but more can be provided as illustrated in FIG. 6C.

In all cases it is desired to firmly fix the nozzle assembly to the turbine housing such that precise concentric and axial spatial relationships are maintained between the nozzle assembly and the rotating hollow shaft and between the nozzle assembly and the atomizer bell. This may be accomplished by incorporating into the nozzle assembly a portion of the outer surface which is dimensioned to provide an interference fit with precise alignment of the assembly in the housing; or alternatively providing a flange at the inlet end of the nozzle assembly which can be affixed precisely to the housing with screws or other suitable means; or a combination of both fixing methods.

In another embodiment illustrated in FIGS. 7A, 7B and 7C, a solid round rod 50 of preferably solvent resistent material is ground to form channels or grooves 52 lengthwise on the peripheral surface of the rod. The grooves 52 may be formed on only a portion of the rod 50, but should extend to the outlet end of the rod. Additional aligned grooves may then be formed from the inlet end of the rod to complete the grooved passageways 52 from the inlet end to the outlet end. The rod 50 may also have a central bore 54. A sleeve 56 is then fit over the rod to seal the grooves 52 from each other and form the nozzle array at the outlet end.

It is further noted that the axial position of the nozzles relative to the bell may affect performance of the atomizer. For example, the maximum distance between the nozzle array and the bell is ⅛ to 3/16 of an inch and the minimum distance (depending on tolerances) is 1/1000 of an inch. However, in a multiple tube array, interstices or longitudinally oriented spaces between tubes may exist. Also, tubes in the array that are not conveying fluid present an empty space. The interstices or empty tube spaces provide an area into which the sprayed solution may migrate. For example, some highly volatile solutions may vaporize and migrate into the empty tubes and interstices, thus degrading atomizer performance. Experiments have shown that optimal atomizer performance is obtained by providing a space of 50 to 100 thousandths of an inch between the nozzle array and the bell surface. Performance is further improved with a nozzle structure like that of FIGS. 6A, 6B and 6C or FIGS. 7A, 7B, 7C which eliminates interstices between adjacent tubes.

Special configurations of the ends of the tubes may be desirable to center their fluid injection points on the central axis of the atomizer bell which should coincide with the central axis of the housing. This is true particularly with respect to those toward the outside or perimeter of the array. This will assure an even distribution of spray emanating from the atomizer, which in turn results in equal coating thicknesses among all devices in a batch. Means to direct the fluid exiting the tubes toward the exact center of the bell could include bevelling, bending, crimping and/or reducing the ends of the individual injector tubes, as illustrated in FIGS. 5A, 5B, 5C and 5D. In other words, the ends of the injector tubes could be formed into individually configured nozzle structures.

For example, FIG. 5A illustrates a squared configuration in which the fluid spray (represented by arrows) is parallel to the central longitudinal axis. In FIG. 5B, the ends of the tubes of the perimeter tubes 30A, 30B are longer than the central tube 30C and angled toward the central longitudinal axis. This configuration can be made by bevelling the array or bending the perimeter tubes. FIG. 5C illustrates a configuration in which the diameter of the perimeter tubes 30A, 30B is reduced, and the smaller diameter tubes have a length greater than the central tube 30C. The smaller diameter tubes are bent toward the central longitudinal axis to direct the fluids toward the central longitudinal axis. In FIG. 5D, the perimeter tubes 30A, 30B are bevelled like FIG. 5B, but drilled so that the perimeter tubes direct their flows toward the central horizontal axis. Although only three tubes 30A, 30B and 30C are shown in FIGS. 5A–5D, the configurations are applicable to arrays having more tubes.

With the present invention, each feed tube and injection port can deliver individual coating fluids to the photoreceptor, the differing coating fluids being applied simultaneously through different tubes, or being applied sequentially for improved photoreceptor layering effects. In the former case, the fluids are mixed at the atomizer bell, thus improving the mixing process and eliminating the need for mixture prior to entry into the atomizer. A coating fluid and solvent can be mixed in this manner. In the later case, flushing of one tube with a solvent prior to application of a coating fluid through a different tube is unnecessary since each tube is dedicated to a fluid source. Other tubes in the array can be dedicated to bell cleaning solvents or solvents for chamber humidification. The overall effect is a reduction in cycle time and avoidance of flushing procedures and cross contamination of various coating fluids.

In another application, the multiple feed tube/multiple injection port atomizer in accordance with the invention is applicable to industries that apply different paint colors or overcoatings to different products, such as vehicle bodies in the automotive industry. The present invention will allow each feed tube to be dedicated to a different color, thus reducing the need to flush a feed tube and permitting rapid changes of color.

The invention has been described with reference to its preferred embodiments which are intended to be illustrative and not limiting. Various changes may be made without departing from the spirit and scope of the invention as defined in the following claims.

What is claimed is:

1. A rotary atomizer for spraying fluids toward an object to be coated with the fluids, comprising:
    an atomizer housing defining a central longitudinal axis and enclosing a hollow shaft rotating about the longitudinal axis and protruding from an outlet end of the housing and a plurality of parallel non-coaxial feed tubes within the hollow shaft between an inlet end and the outlet end of the housing;
    distribution means mounted on the shaft and spaced from the outlet end of the housing, for atomizing the fluids conveyed by the plurality of feed tubes onto an outwardly facing inner surface of the distribution means and directing a spray of the fluids radially outward toward the object to be coated; and
    a plurality of injection ports, each communicating with a corresponding feed tube and being located at the outlet end of the housing for injecting the fluids toward the distribution means;
    wherein the injection ports are symmetrically radially positioned about the central longitudinal axis of the housing to minimize a radial distance between the central longitudinal axis and the injection ports.

2. The atomizer of claim 1:
    wherein each feed tube has an inlet communicating with a fluid source different from other fluid sources for other inlets of other feed tubes.

3. The atomizer of claim 1:
    wherein the number of feed tubes and corresponding injection ports is in the range of two to twenty.

4. The atomizer of the claim 1:
    wherein the number of feed tubes is in the range of three to seven.

5. The atomizer of claim 1:
    wherein an outlet of at least one of the injection ports is angled to direct the fluid toward the central longitudinal axis.

6. The atomizer of claim 1:
    wherein at least one injection port has an individually configured nozzle structure for directing fluid toward the central longitudinal axis.

7. The atomizer of claim 1:
    wherein outlets of the injection ports in cross section are symmetrically arranged in an array about the central longitudinal axis, the outlets on a perimeter of the array being configured to direct fluid toward the central longitudinal axis.

8. The atomizer of claim 1:
    wherein the feed tubes are stainless steel hypodermic needle tubing.

9. The atomizer of claim 1:
    wherein the feed tubes are teflon tubing.

10. The atomizer of claim 1:
    further comprising securing means for securing together the feed tubes.

11. The atomizer of claim 10:
    wherein the securing means are welds for one feed tube to an adjacent feed tube.

12. The atomizer of claim 10:
    wherein the feed tubes are bundled into an array and the securing means is a sleeve surrounding a perimeter of the array.

13. The atomizer of claim 10:
    wherein the feed tubes are bundled into an array and the securing means is a polymer encasing the array.

14. The atomizer of claim 1, wherein outlets of the injection ports are defined by bores extending through a solid material to eliminate interstices between outlets.

15. The atomizer of claim 1, wherein the feed tubes are defined by a corresponding plurality of grooves in a peripheral surface of a rod and a sleeve fitted about the rod to seal one groove from an adjacent groove.

16. The atomizer of claim 1, wherein a distance between the nozzle ports and the distribution means is between 50–100 thousandths of an inch.

17. The atomizer of claim 1, wherein the feed tubes are of equal cross-sectional area.

* * * * *